United States Patent
Chen et al.

(10) Patent No.: US 7,924,614 B2
(45) Date of Patent: Apr. 12, 2011

(54) MEMORY AND BOUNDARY SEARCHING METHOD THEREOF

(75) Inventors: Chung-Kuang Chen, Hsinchu (TW); Han-Sung Chen, Hsinchu (TW); Chun-Hsiung Hung, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 146 days.

(21) Appl. No.: 12/355,962

(22) Filed: Jan. 19, 2009

(65) Prior Publication Data
US 2010/0182833 A1    Jul. 22, 2010

(51) Int. Cl.
 *G11C 16/04* (2006.01)
(52) U.S. Cl. ............ 365/185.09; 365/185.2; 365/185.21
(58) Field of Classification Search ............ 365/185.09, 365/185.2, 185.21
See application file for complete search history.

(56) References Cited

U.S. PATENT DOCUMENTS

| | | | |
|---|---|---|---|
| 6,807,095 B2 | 10/2004 | Chen et al. | |
| 7,142,455 B1 | 11/2006 | Lee et al. | |
| 7,330,376 B1 | 2/2008 | Chen et al. | |
| 2005/0083726 A1* | 4/2005 | Auclair et al. | 365/154 |
| 2007/0297245 A1 | 12/2007 | Mokhlesi | |
| 2009/0003058 A1* | 1/2009 | Kang | 365/185.03 |
| 2009/0049364 A1* | 2/2009 | Jo et al. | 714/763 |
| 2009/0210776 A1* | 8/2009 | Cho et al. | 714/805 |
| 2010/0172191 A1* | 7/2010 | Chen et al. | 365/189.05 |

FOREIGN PATENT DOCUMENTS

| | | |
|---|---|---|
| TW | 541535 | 7/2003 |
| TW | 200814084 | 3/2008 |

* cited by examiner

*Primary Examiner* — Hoai V Ho
(74) *Attorney, Agent, or Firm* — J.C. Patents (57) ABSTRACT

A memory and a boundary searching method thereof are provided therein. When searching a boundary of a threshold voltage distribution of the memory, data errors resulted from tail bits of the memory would be corrected. Therefore, a sensing window could be broader, and the boundary of the threshold voltage distribution could be determined precisely.

10 Claims, 7 Drawing Sheets

MEMORY AND BOUNDARY SEARCHING METHOD THEREOF

BACKGROUND OF THE INVENTION

1. Field of Invention

The present invention is related to a memory and a boundary searching method thereof, and more specifically, to a non-volatile memory and a boundary searching method thereof with an error correction code (ECC) function for correcting data errors resulted from tail bits of the non-volatile memory when searching a boundary of a threshold voltage distribution of the non-volatile memory.

2. Description of Related Art

Non-volatile memory is popular and used in a wide range of electronic devices. The main characteristic of non-volatile memory is that its stored information is retained even after the power supply is terminated, thus making it suitable for portable electronic products, e.g. portable storage drives, digital cameras, mobile phones, mp3 players, etc. The information storage mechanism in a non-volatile memory cell is based on the quantity of electric charge trapped in a charge storage element of the non-volatile memory cell. The threshold voltage of the non-volatile memory cell is associated with the quantity of the trapped electric charge, and information stored in the memory cell could be distinguished based on the threshold voltage.

Along with the rapid development of science and technology at present, for storing a large amount of data, non-volatile memory is being developed to have larger capacity, higher speed, longer service life, and being more power-saving. Generally, non-volatile memory with a capacity of hundreds of M (megabytes) already cannot meet the demands, and memory with a capacity of several G (gigabytes) or hundreds of G (gigabytes) has appeared. However, the property of high capacity of the non-volatile memory may easily cause the range of the threshold voltage distribution of the memory to become excessively large.

Figure 1:
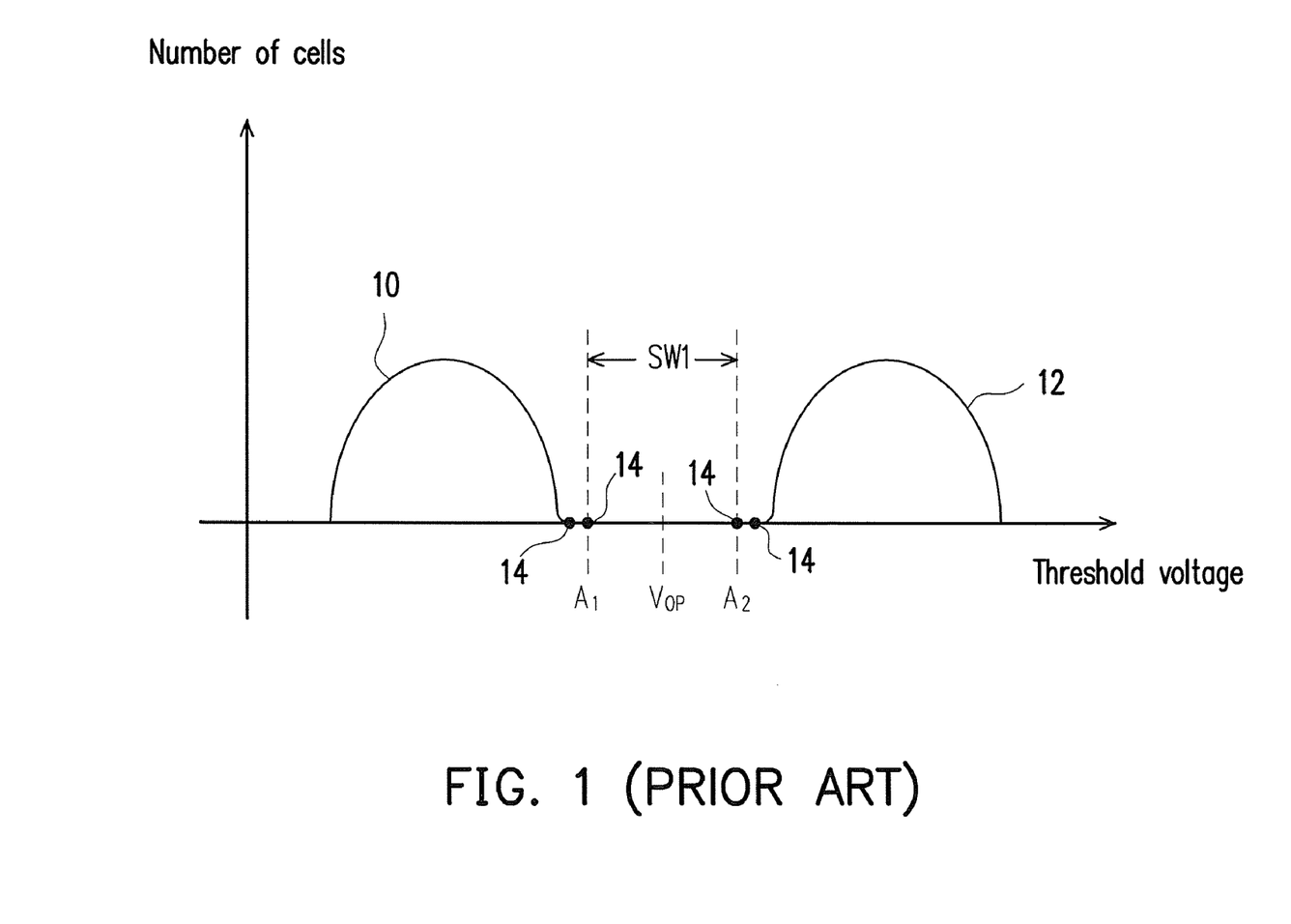
FIG. 1 is diagram illustrating the threshold voltage distributions of a non-volatile memory according to the prior art.

Please refer to FIG. 1, which is diagram illustrating the threshold voltage distributions 10 and 12 of a non-volatile memory according to the prior art. The horizontal axis represents the threshold voltage, and the vertical axis represents the number of cells. The threshold voltage distribution 10 indicates a relationship between the threshold voltage and the number of memory cells having data "1", and the threshold voltage distribution 12 indicates a relationship between the threshold voltage and the number of memory cells having data "0". When reading data from the non-volatile memory, an operational word line voltage $V_{OP}$ is applied to the memory cells. Since the read-out currents of the memory cells would reflect the differences of the threshold voltages of the memory cells, the data stored in the memory cells could be determined according to values of the read-out currents. There are several tail bits 14 among the cells of the non-volatile memory. The threshold voltages of the tail bits are distributed around the edges of the threshold voltage distributions 10 and 12. Because of the existence of the tail bits 14, a boundary of the threshold voltage distribution 10 would be $A_1$, and a boundary of the threshold voltage distribution 12 would be $A_2$, as shown in FIG. 1. Therefore, a sensing window SW1 of the non-volatile memory located between the boundaries $A_1$ and $A_2$ is narrowed, such that it is difficult to distinguish each state of data stored in the non-volatile memory.

SUMMARY OF THE INVENTION

Accordingly, the present invention is directed to provide a memory and a boundary searching method thereof with an error correction code (ECC) function for correcting data errors resulted from tail bits of the memory when searching a boundary of a threshold voltage distribution of the memory.

The present invention provides a method for searching a boundary of a threshold voltage distribution of a memory. The memory comprises memory cells and an error correction code (ECC) circuit. The method comprising steps of: applying an initial word line voltage to the memory cells for reading the memory cells; enabling the ECC circuit to correct data read from the memory cells; checking whether the data corrected by the ECC circuit are accurate or not; and adjusting the word line voltage if all of the data corrected by the ECC circuit are accurate.

The present invention further provides a memory. The memory comprises a plurality of memory cells for storing data, a word line voltage regulator coupled to the memory cells, a sense amplifier coupled to the memory cells, an error correction code (ECC) circuit coupled to the sense amplifier, and a boundary searching circuit coupled to the ECC circuit. The word line voltage regulator applies a word line voltage to the memory cells to read data from the memory cells. The sense amplifier senses read-out currents from the memory cells and then outputs the data of the memory cells. The ECC circuit corrects data read from memory cells. The boundary searching circuit checks whether the data corrected by the ECC circuit are accurate or not and controls the word line voltage regulator to adjust the word line voltage if all of the data corrected by the ECC circuit are accurate.

According to an embodiment of the present invention, the memory is a non-volatile memory.

According to an embodiment of the present invention, the step for adjusting the word line voltage comprises saving a previously adjusted word line voltage as the boundary of the threshold voltage distribution of the memory if not all of the data corrected by the ECC circuit are accurate.

According to an embodiment of the present invention, the memory further comprises a plurality of reference circuits for providing a reference current. When reading the data from the memory cells, read-out currents of the memory cells are compared with the reference current.

According to an embodiment of the present invention, each of the reference circuits is a reference memory cell. The word line voltage is applied to the reference memory cells so as to provide the reference current when reading the data from the memory cells.

Because of the ECC circuit, all data errors resulted from the tail bits of the memory cells would be corrected. Therefore, an accurate boundary of the threshold voltage distribution of the memory would be found, and a sensing window of the memory would be broader.

In order to make the aforementioned and other objects, features and advantages of the present invention comprehensible, several preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2:
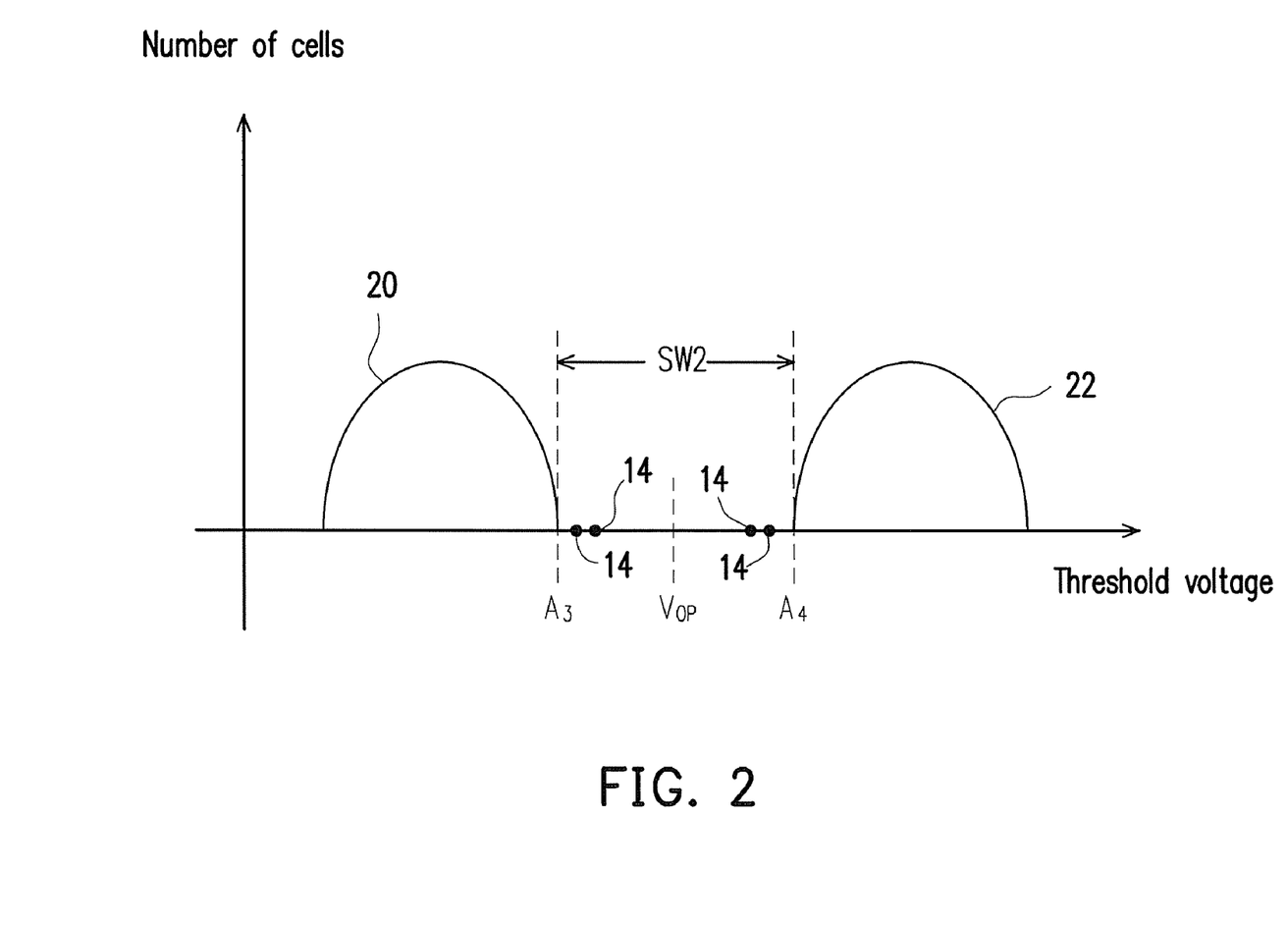
FIG. 2 is a diagram illustrating the threshold voltage distributions of a non-volatile memory according to an embodiment of the present invention.

In order to precisely find a boundary of a threshold voltage distribution of the memory, the present invention utilizes an error correction code (ECC) function to correct the errors resulted from the tail bits of the memory when read operations for finding the boundary are performing. Please refer to FIG. 2, which is a diagram illustrating the threshold voltage distributions 20 and 22 of a non-volatile memory according to an embodiment of the present invention. For simplicity's sake, in the embodiment of the present invention, the threshold voltage distributions 20 and 22 are obtained by measuring the same non-volatile memory having the original threshold voltage distributions 10 and 12 shown in FIG. 1. As shown in FIG. 2, because the present invention utilizes the ECC function to correct the errors resulted from the tail bits 14, a boundary of the threshold voltage distribution 20 would be $A_3$, and a boundary of the threshold voltage distribution 22 would be $A_4$. The boundary $A_3$ is less than the boundary $A_1$, and the boundary $A_4$ is greater than the boundary $A_2$. Therefore, a novel sensing window SW2 of the non-volatile memory could be found between the boundaries $A_3$ and $A_4$, where the sensing window SW2 is broader than the sensing window SW1. Therefore, we can define a precise sensing window for most memory cells.

Figure 3:
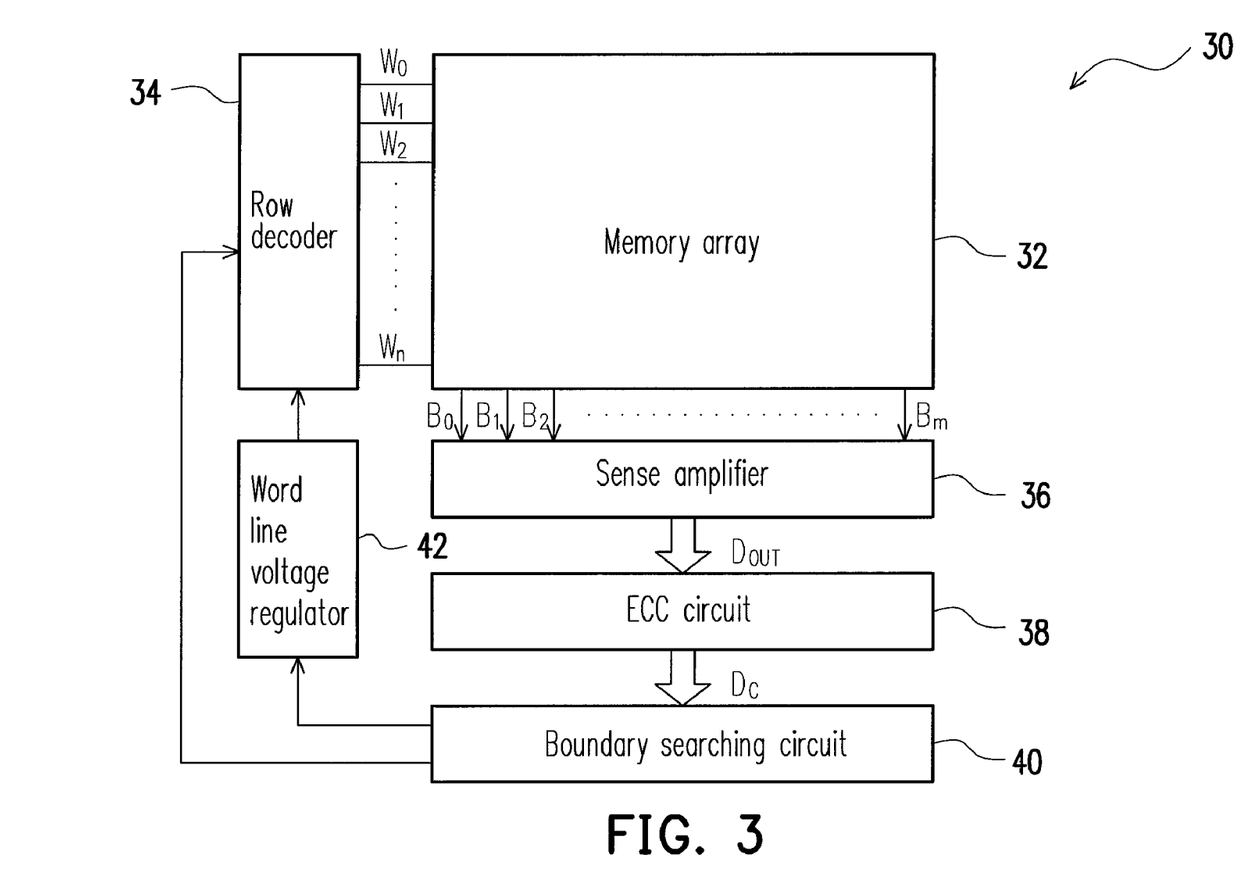
FIG. 3 is a functional block diagram of a memory according to an embodiment of the present invention.

Please refer to FIG. 3, which is a functional block diagram of a memory 30 according to an embodiment of the present invention. The memory 30 has a memory array 32, a row decoder 34, a sense amplifier 36, an ECC circuit 38, a boundary searching circuit 40, and a word line voltage regulator 42. The row decoder 34 is coupled to the memory array 32 to apply word line voltages via a plurality of word lines $W_0$-$W_n$ of the memory 30 so as to read data from the memory array 32. The sense amplifier 36 is coupled to the memory array 32 via a plurality of bit lines $B_0$-$B_m$ of the memory 30 to sense read-out currents from the memory array 32 so as to output the data $D_{OUT}$ of the memory array 32. The ECC circuit 38 is coupled to the sense amplifier 36 to correct the data $D_{OUT}$ from the sense amplifier 36 and output the corrected data $D_C$. The boundary searching circuit 40 is coupled to the ECC circuit 38 to check whether all of the corrected data $D_C$ are accurate or not. If all of the corrected data $D_C$ are accurate, the boundary searching circuit 40 controls the word line voltage regulator 42 to adjust the word line voltage applied to the memory array 32. The word line voltage regulator 42 is coupled between the boundary searching circuit 40 and the memory array 32. The word line voltage regulator 42 provides the adjusted word line voltage to the memory array 32 under the control of the boundary searching circuit 40.

Figure 4:
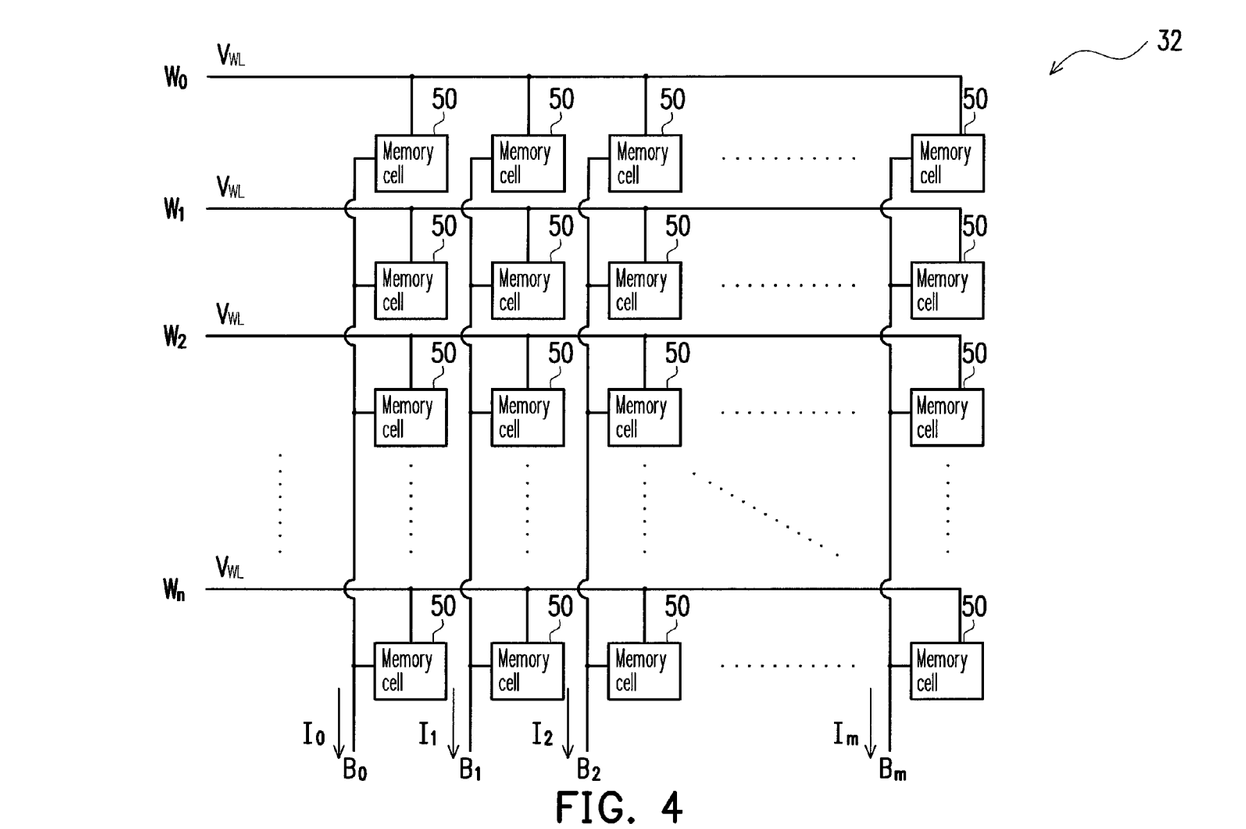
FIG. 4 is a functional block diagram of the memory array shown in FIG. 3.

Please refer to FIG. 4, which is a functional block diagram of the memory array 32 shown in FIG. 3. The memory array 32 has a plurality of memory cells 50. Each of the memory cells 50 is coupled to a corresponding one of the word lines $W_0$-$W_n$ and to a corresponding one of the bit lines $B_0$-$B_m$. In the embodiment, the memory cells 50 are single-bit cells that each stores one bit. However, the present invention is not limited thereto. For example, in another embodiment, the memory cells 50 are multilevel cells that each stores two or more bits. In the embodiment, when reading the data of the memory cells 50, the word lines $W_0$-$W_n$ are sequentially applied with the word line voltage $V_{WL}$, such that the read-out currents $I_0$-$I_m$ associated with the data of the memory cells 50 are output through the bit lines $B_0$-$B_m$.

Figure 5:
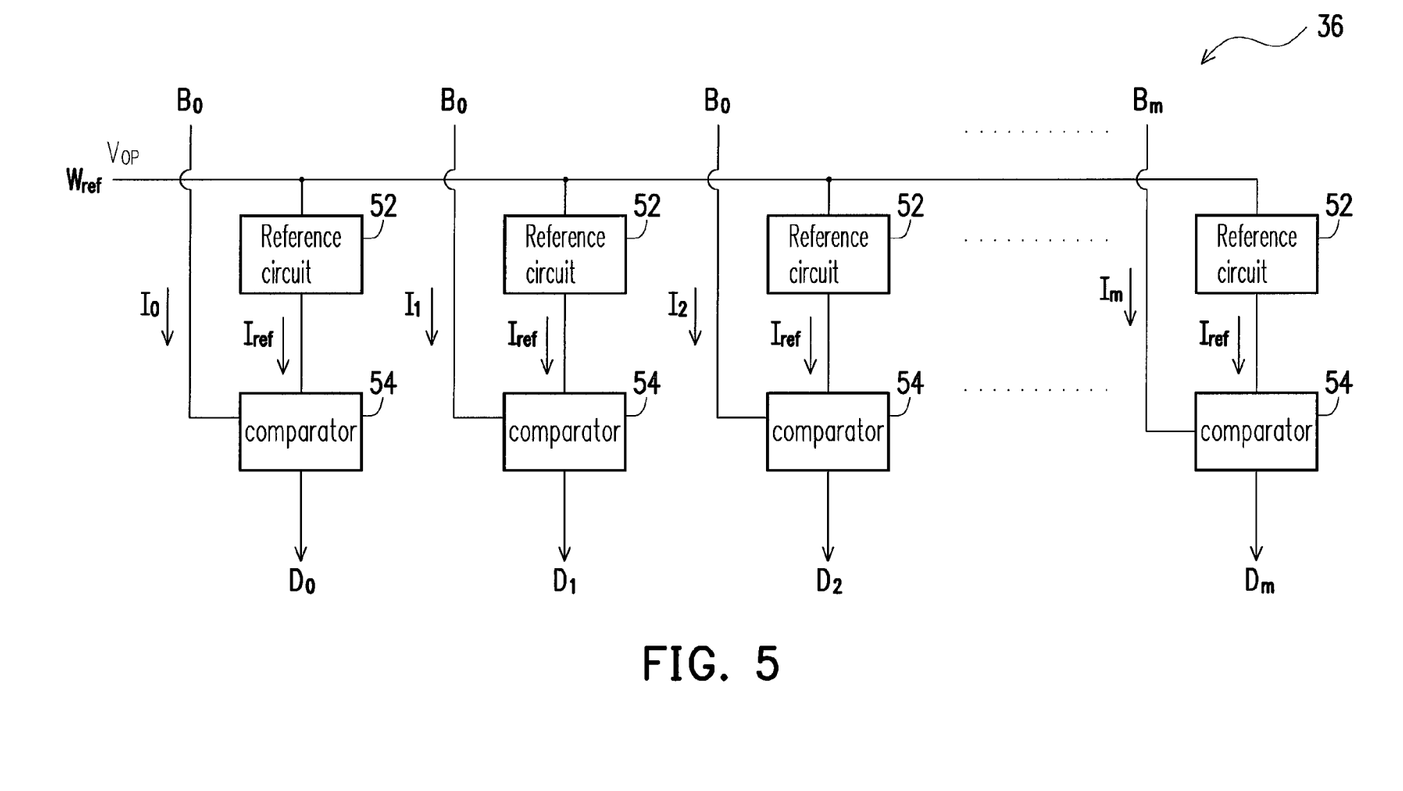
FIG. 5 is a functional block diagram of the sense amplifier shown in FIG. 3.

Please refer to FIG. 5, which is a functional block diagram of the sense amplifier 36 shown in FIG. 3. The sense amplifier 36 has a plurality of reference circuits 52 and a plurality of comparators 54. The reference circuits 52 are coupled to a reference word line $W_{ref}$, and each of the comparators 54 is coupled to a corresponding one of the bit lines $B_0$-$B_m$ and to a corresponding one of the reference circuits 52. In an embodiment, each of the reference circuits 52 is a reference memory cell. When reading the data of the memory cells 50, the operational word line voltage $V_{OP}$ is applied to the reference word line $W_{ref}$, such that each of the reference circuits 52 outputs a reference current $I_{ref}$. The comparators 54 would compare the read-out currents $I_0$-$I_m$ with the reference current $I_{ref}$ so as to output the data $D_0$-$D_m$ of the memory cells 50. It should be noted that the read-out data $D_{OUT}$ shown in FIG. 4 is composed of the data $D_0$-$D_m$ of each row of the memory cells 50.

Figure 6:
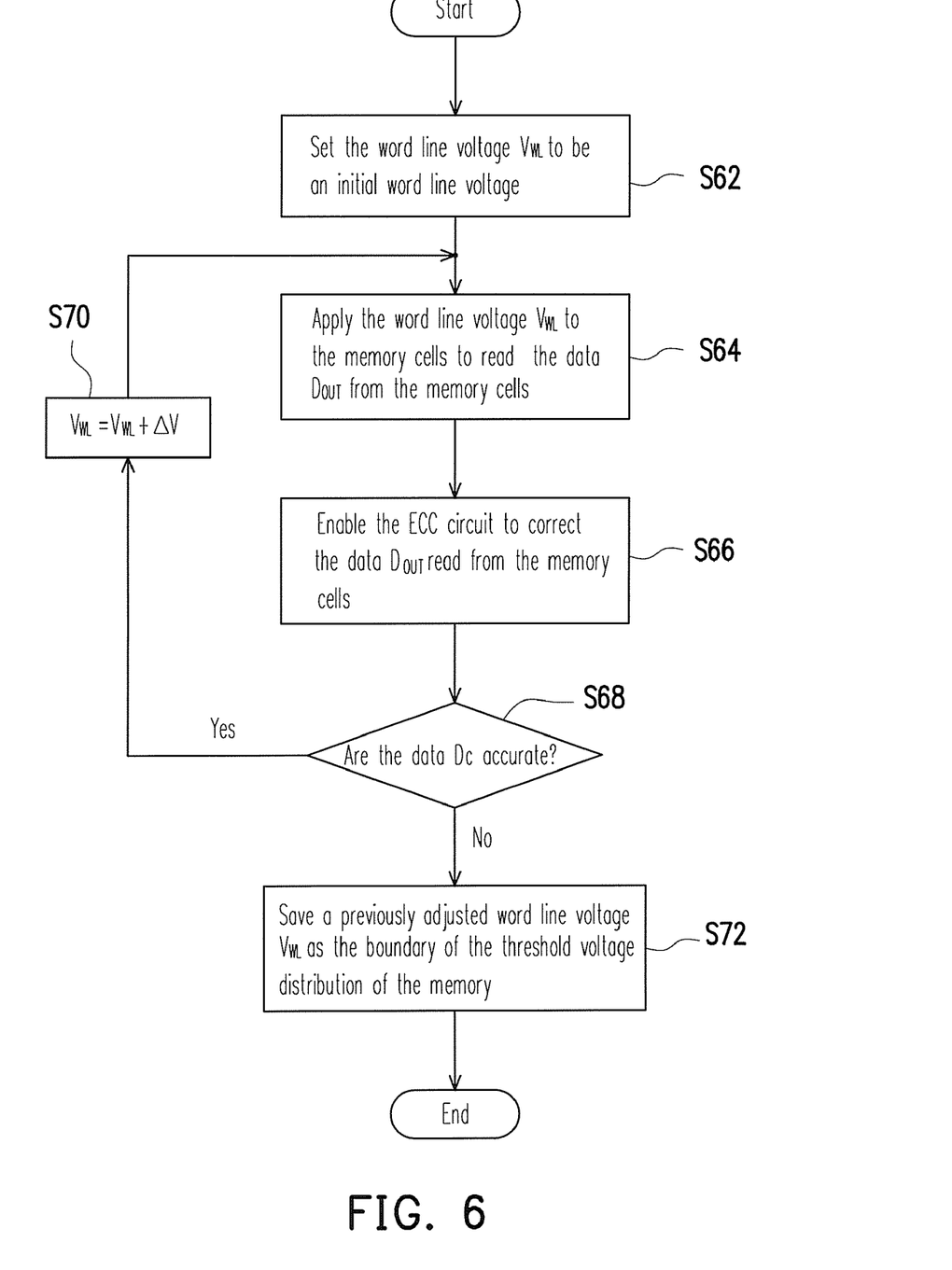
FIG. 6 is a flow chart of the method for searching a boundary of the threshold voltage distributions of the memory in FIG. 3 according to an embodiment of the present invention.
Figure 7:
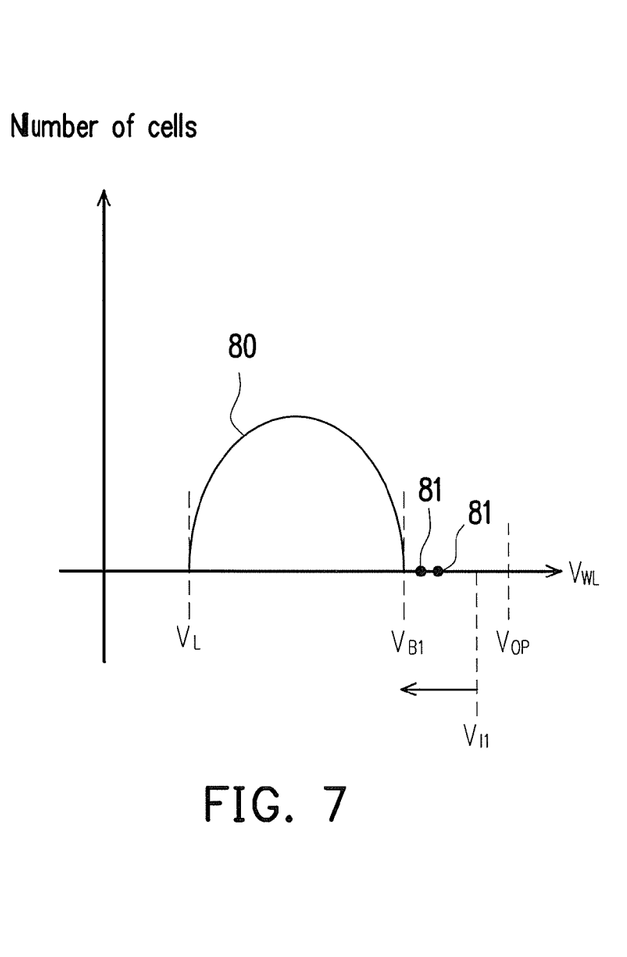
FIG. 7 is a diagram illustrating a threshold voltage distribution of the memory shown in FIG. 3.

Please refer to FIGS. 6 and 7 with reference of FIGS. 3 and 4. FIG. 6 is a flow chart of the method for searching a boundary of the threshold voltage distributions of the memory 30 in FIG. 3 according to an embodiment of the present invention. FIG. 7 is a diagram illustrating a threshold voltage distribution 80 of the memory 30. Firstly, in the step S62, the word line voltage $V_{WL}$ is set to be an initial word line voltage $V_{I1}$. Generally, the value of $V_{I1}$ is larger than the highest threshold voltage $V_{B1}$ of the threshold voltage distribution 80, but the present invention is not limited thereto. Second, in the step S64, the word line voltage $V_{WL}$ is applied to the memory cells 50 via the word lines $W_0$-$W_n$ so as to read the data $D_{OUT}$ from the memory cells 50. When finishing reading the data $D_{OUT}$ from the memory cells 50, the ECC circuit 38 is enabled to correct the data $D_{OUT}$ and then outputs the corrected data $D_C$ (Step S66). Then, in the step S68, the boundary searching circuit 40 checks whether all of the corrected data $D_C$ are accurate or not. If all of the corrected data $D_C$ are accurate, the boundary searching circuit 40 controls the word line voltage regulator 42 to adjust the word line voltage $V_{WL}$ by adding a voltage offset $\Delta V$ (Step S70), and the steps S64-S68 would be repeated. In the case, the value of the voltage offset $\Delta V$ is negative. If it is determined that not all of the corrected data $D_C$ are accurate (e.g. with data of '1') in the step S68, the boundary searching circuit 40 saves a previously adjusted word line voltage $V_{WL}$ as the boundary $V_{B1}$ of the threshold voltage distribution 80 (Step S72). In the embodiment, the voltage level of the previously adjusted word line voltage $V_{WL}$ is obtained by subtracting voltage offset $\Delta V$ from the current word line voltage. It should be noted that the data of the tail bits 81 are accurate when the word line voltage $V_{WL}$ is $V_{B1}$. However, since the ECC circuit 38 would correct the errors resulted from the tail bits 81 when the word line voltage $V_{WL}$ is $V_{B1}$, all of the data $D_C$ would be accurate. Therefore, the whole procedure for searching the boundary of the threshold voltage distribution 80 would be stopped when the boundary $V_{B1}$ is found by decreasing the word line voltage $V_{WL}$. Additionally, it should be noted that a number of the tail bits 81 is less than or equal to a maximum of error bits that can be corrected by the ECC circuit 38.

Figure 8:
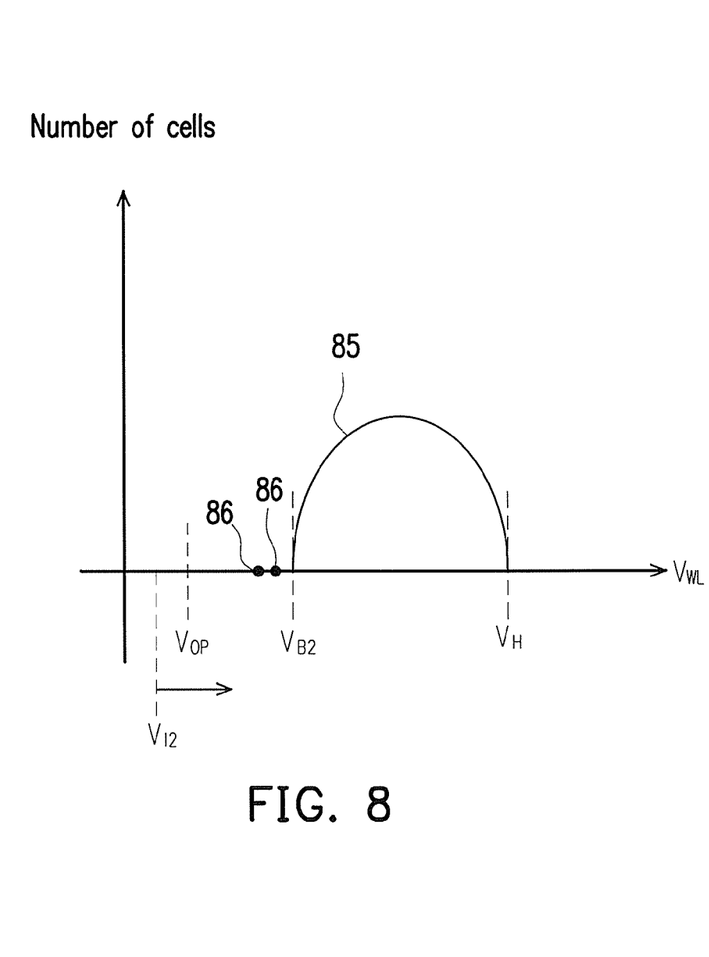
FIG. 8 is a diagram illustrating another threshold voltage distribution of the memory shown in FIG. 3.

A boundary of another threshold voltage distribution 85 of the memory 30 could be found similarly. Please refer to FIGS. 6 and 8 with reference of FIGS. 3 and 4. FIG. 8 is a diagram illustrating the threshold voltage distribution 85 of the memory 30. During searching the low boundary of the threshold voltage distribution 85, the word line voltage $V_{WL}$ is initiated to be $V_{I2}$ (Step S62). Generally, the value of $V_{I2}$ is less than the lowest threshold voltage $V_{B2}$ of the threshold voltage distribution 85. However, the present invention is not limited thereto. Second, in the step S64, the word line voltage $V_{WL}$ is applied to the memory cells 50 via the word lines $W_0$-$W_n$ so as to read the data $D_{OUT}$ from the memory cells 50. When finishing reading the data $D_{OUT}$ from the memory cells 50, the ECC circuit 38 is enabled to correct the data $D_{OUT}$ and then outputs the corrected data $D_C$ (Step S66). Then, in the step S68, the boundary searching circuit 40 checks whether all of the corrected data $D_C$ are accurate or not. If all of the corrected data $D_C$ are accurate, the boundary searching circuit 40 controls the word line voltage regulator 42 to adjust the word line voltage $V_{WL}$ by adding a voltage offset $\Delta V$ (step S70), and the steps S64-S68 would be repeated. In the case, the value of the voltage offset $\Delta V$ is positive. If it is determined that all of the corrected data $D_C$ are not all '0' in the step S68, the boundary searching circuit 40 saves a previously adjusted word line voltage $V_{WL}$ as the boundary $V_{B2}$ of the threshold voltage distribution 80. In the embodiment, the voltage level of the previously adjusted word line voltage $V_{WL}$ is obtained by subtracting voltage offset $\Delta V$ from the current word line voltage. It should be noted that the data of the tail bits 86 are accurate when the word line voltage $V_{WL}$ is $V_{B2}$. However, since the ECC circuit 38 would correct the errors resulted from the tail bits 86 when the word line voltage $V_{WL}$ is $V_{B2}$, all of the data $D_C$ would be accurate. Therefore, the whole procedure for searching the boundary of the threshold voltage distribution 85 would be stopped when the boundary $V_{B2}$ is found by increasing the word line voltage $V_{WL}$. Additionally, it should be noted that a number of the tail bits 86 is less than or equal to a maximum of error bits that can be corrected by the ECC circuit 38.

In comparison to the prior art, the present invention corrects data errors resulted from tail bits of a memory when searching a boundary of a threshold voltage distribution of the memory. Therefore, a sensing window could be broader, and the boundary of the threshold voltage distribution could be determined precisely.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed:

1. A method for searching a boundary of a threshold voltage distribution of a memory, the memory comprising a plurality of memory cells and an error correction code (ECC) circuit, the method comprising steps of:

applying an initial word line voltage to the memory cells for reading the memory cells;
enabling the ECC circuit to correct data read from the memory cells;
checking whether the data corrected by the ECC circuit are accurate or not; and
adjusting the word line voltage if all of the data corrected by the ECC circuit are accurate.

2. The method as claimed in claim 1, wherein the step for adjusting the word line voltage comprises:
once not all of the data corrected by the ECC circuit are accurate, saving a previously adjusted word line voltage as the boundary of the threshold voltage distribution of the memory.

3. The method as claimed in claim 1 further comprising:
providing a reference current;
wherein read-out currents of the memory cells are compared with the reference current when reading the data from the memory cells.

4. The method as claimed in claim 1, wherein the memory further comprises a plurality of reference circuits for providing a reference current, read-out currents of the memory cells are compared with the reference current when reading the data from the memory cells.

5. The method as claimed in claim 4, wherein each of the reference circuits is a reference memory cell, and the word line voltage is applied to the reference memory cells so as to provide the reference current when reading the data from the memory cells.

6. The method as claimed in claim 1, wherein the memory is a non-volatile memory.

7. A memory, comprising:
a plurality of memory cells for storing data;
a word line voltage regulator coupled to the memory cells, for applying a word line voltage to the memory cells to read data from the memory cells;
a sense amplifier, coupled to the memory cells, for sensing read-out currents from the memory cells so as to output the data of the memory cells;
an error correction code (ECC) circuit coupled to the sense amplifier, for correcting the data of the memory cells; and
a boundary searching circuit coupled to the ECC circuit, for checking whether the data corrected by the ECC circuit are accurate or not, and controlling the word line voltage regulator to adjust the word line voltage if all of the data corrected by the ECC circuit are accurate.

8. The memory as claimed in claim 7, wherein once not all of the data corrected by the ECC circuit are accurate, the boundary searching circuit saves a previously adjusted word line voltage as a boundary of the threshold voltage distribution of the memory.

9. The memory as claimed in claim 7 further comprising a plurality of reference circuits for providing a reference current, wherein read-out currents of the memory cells are compared with the reference current when reading the data from the memory cells.

10. The memory as claimed in claim 9, wherein each of the reference circuit is a reference memory cell, and the word line voltage is applied to the reference memory cells so as to provide the reference current when reading the data from the memory cells.

* * * * *